United States Patent [19]
Khayrallah et al.

[11] Patent Number: 5,968,199
[45] Date of Patent: Oct. 19, 1999

[54] HIGH PERFORMANCE ERROR CONTROL DECODER

[75] Inventors: Ali S. Khayrallah, Apex; Raymond L. Toy; Sandeep Chennakeshu, both of Cary, all of N.C.

[73] Assignee: Ericsson Inc., Research Triangle Park, N.C.

[21] Appl. No.: 08/768,530

[22] Filed: Dec. 18, 1996

[51] Int. Cl.$^6$ .................................................. H03M 13/00
[52] U.S. Cl. ........................................ 714/783; 714/780
[58] Field of Search ................................ 371/37.06, 37.4; 714/755, 780, 783

[56] References Cited

U.S. PATENT DOCUMENTS

| | | | |
|---|---|---|---|
| 4,933,956 | 6/1990 | Forney, Jr. .................................. | 375/94 |
| 5,081,681 | 1/1992 | Hardwick et al. ........................ | 381/51 |
| 5,226,084 | 7/1993 | Hardwick et al. ........................ | 381/41 |
| 5,247,579 | 9/1993 | Hardwick et al. ........................ | 381/40 |
| 5,491,772 | 2/1996 | Hardwick et al. ..................... | 395/2.35 |
| 5,517,511 | 5/1996 | Hardwick et al. ..................... | 371/37.1 |

OTHER PUBLICATIONS

Hassan et al., "On Decoding Concatenated Codes", IEEE Transactions on Information Theory, vol. 36, No. 3, May 1990, pp. 677–683.

Soft Decoding Techniques for Codes and Lattices, Including the Golay Code and the Leech Lattice by J.H. Conway and N.J. A. Sloane; 1986 IEEE, vol. 32, No. 1, Jan. 1986, pp. 25/58–34/58.

PCT Search Report, Apr. 24, 1998, Application No. PCT/US 97/22606.

*Primary Examiner*—Stephen M. Baker
*Attorney, Agent, or Firm*—Jenkens & Gilchrist, P.C.

[57] ABSTRACT

An error control decoder receives a received vector to be decoded. The decoder then calculates, as an error estimate, the Euclidean distance between a codeword choice and the received vector. The output error estimate is appropriately scaled and quantized in accordance with the particular code being processed by the decoder. The efficient Conway-Sloane algorithm is extended for use in connection with the decoding of shortened Golay codes. A modification is made to the generator matrix for the Golay code to produce a modified generator matrix that is unique for each shortened code. The modified generator matrix is then implemented in the Conway-Sloane algorithm to identify the best codeword for conversion to its corresponding information bits for output.

10 Claims, 4 Drawing Sheets

HIGH PERFORMANCE ERROR CONTROL DECODER

BACKGROUND OF THE INVENTION

Technical Field of the Invention

The present invention relates to vocoding systems and, in particular, to a high performance implementation with respect to performing decoding and error estimation processes within an improved multi-band excitation (IMBE) vocoding system.

Description of Related Art

The IMBE Vocoding System

Additional information on the IMBE vocoding system, as well as other speech communication systems, may be obtained by reference to the following references:

U.S. Pat. No. 5,081,681, entitled "Method and Apparatus for Phase Synthesis for Speech Processing";

U.S. Pat. No. 5,226,084, entitled "Method for Speech Quantization and Error Correction";

U.S. Pat. No. 5,247,579, entitled "Methods for Speech Transmission"; and

U.S. Pat. No. 5,491,772, entitled "Methods for Speech Transmission".

The disclosures of these references are incorporated by reference herein.

Reference is now made to FIG. 1 wherein there is shown a block diagram of a transmitter side 10 for an improved multi-band excitation (IMBE) vocoding system. For each 20 ms segment of speech (having L harmonics) to be encoded, a quantizer 12 generates a plurality of quantizer values $b_0$ through $b_{L+2}$. The quantizer value $b_0$ comprises the pitch of the speech segment. The quantizer value $b_1$ comprises the voiced/unvoiced bit vector of the speech segment. The quantizer value $b_2$ comprises the gain of the speech segment. Finally, the quantizer values $b_3$ through $b_{L+2}$ comprise the remaining spectral amplitudes of the L harmonics of the speech segment.

A bit vector prioritization unit 14 of the transmitter side 10 receives the plurality of quantizer values $b_0$ through $b_{L+2}$ and rearranges them into a set of p prioritized bit vectors $u_0$ through $u_p$. This prioritization is made in accordance with the importance of the bits. In this context, an important bit is one that would cause a large distortion in the reconstructed speech if it were received incorrectly. Each 20 ms segment of speech is accordingly compressed to n prioritized bits comprising the bit vectors $u_0$ through $u_p$ by the bit vector prioritization unit 14.

The transmitter side 10 further includes a plurality of forward error correction (FEC) encoders 16 implementing error control codes of differing capabilities to transform the bit vectors $u_0$ through $u_p$ into encoded vectors $v_0$ through $v_p$. An additional m' parity and/or error correction bits are added by the FEC encoders 16 to the n' prioritized speech bits comprising bit vectors $u_0$ through $u_p$ to output the encoded vectors $v_0$ through $v_p$. Given the decreasing importance of the speech bits in the bit vectors $u_0$ through $u_p$, the error control capabilities provided in the encoded vectors $v_0$ through $v_p$ by the FEC encoders 16 correspondingly decrease.

In a conventional 6.4 kbps IMBE speech coder such as that standardized for the INMARSAT-M satellite communications system, n'=83, m'=45 and p=7. The bit vectors $u_0$ and $u_1$ are encoded by a first and second FEC encoder 16(1) and 16(2), respectively, each implementing a (24,12) extended Golay code to generate the encoded vectors $v_0$ and $v_1$. The bit vectors $u_2$ through $u_6$ are encoded by a third through seventh FEC encoders 16(3)–16(7), respectively, each implementing a (15,11) Hamming code to generate encoded vectors $v_2$ and $v_6$. The remaining bit vector $u_7$ is not encoded, and is thus passed on as the encoded vector $v_7$.

In a 7.1 kbps IMBE speech coder proposed for use in the Ericsson DLMR communications system (see, specifically illustrated in FIG. 1), two modes of operation are proposed. In the first mode, n'=88, m'=54 and p=6. The bit vector $u_0$ is encoded by a first FEC encoder 16(1) implementing a (19,7) shortened Golay code to generate an encoded vector $v_0$. The bit vector $u_1$ is encoded by a second FEC encoder 16(2) implementing a (24,12) extended Golay code to generate encoded vector $v_1$. The bit vectors $u_2$ and $u_3$ are encoded by a third and fourth FEC encoders 16(3) and 16(4), respectively, each implementing a (23,12) Golay code to generate encoded vectors $v_2$ and $v_3$. Finally, the bit vectors $U_4$ and $u_5$ are encoded by a fifth and sixth FEC encoders 16(5) and 16(6), respectively, each implementing a (15,11) Hamming code to generate encoded vectors $v_4$ and $v_5$. The remaining bit vector $u_6$ is not encoded, and is thus passed on as the encoded vector $v_6$.

In the second mode, n'=74, m'=68 and p=6. The bit vector $u_0$ is encoded by a first FEC encoder 16(1) implementing a (19,7) shortened Golay code to generate encoded vector $v_0$. The bit vector $u_1$ is encoded by a second FEC encoder 16(2) implementing an (18,6) shortened Golay code to generate encoded vector $v_1$. The bit vectors $u_2$, $u_3$ and $u_4$ are encoded by a third, fourth and fifth FEC encoders 16(3), 16(4) and 16(5), respectively, each implementing an (18,7) shortened Golay code to generate encoded vectors $v_2$, $v_3$ and $v_4$. Finally, the bit vector $u_5$ is encoded by a sixth FEC encoder 16(6) implementing a (23,12) Golay code to generate encoded vector $v_5$. The remaining bit vector $u_6$ is not encoded, and is thus passed on as the encoded vector $v_6$.

For any of the IMBE speech coders, the transmitter side 10 generated encoded vectors $v_0$ through $v_p$ are interleaved by an interleaver unit 20, and then modulated by a modulator 22 for transmission (as vector c) over a communications channel 24. An example of such a modulator 22 is any known modulator having an M-ary signal constellation (such as quadrature amplitude modulation (QAM) or phase shift keying (PSK)). The communications channel 24 over which the interleaved and modulated code vectors $v_0$ through $v_p$ are transmitted may introduce a number of random and/or burst errors producing interleaved and modulated code vector z.

Reference is now made to FIG. 2 wherein there is shown a block diagram of a receiver side 30 for the improved multi-band excitation (IMBE) vocoding system. An appropriate demodulator 32 is provided for demodulating the communications channel 24 transmitted communication vector z to output on line 34 estimates of the bits within the received code vectors $z_0$ through $z_p$. The demodulator 32 further outputs a corresponding reliability vector r including reliability values for each bit within the received code vectors $z_0$ through $z_p$. The reliability values are indicative of the level of confidence expressed by the demodulator 32 in its estimate of a particular received and demodulated bit. Thus, a larger reliability value within the vector r indicates a higher likelihood of the corresponding bit within the received code vector z being estimated correctly. Demodulators, like that described above, producing bit estimates and reliability values are well known in the art, and thus will not be further described. The received code vectors z and the corresponding reliability vector r are then de-interleaved by a deinterleaver unit 38 to produce the encoded vectors $v_0$ through $v_p$.

The receiver side 30 includes a plurality of error control decoders 40 to transform the encoded vectors $v_0$ through $v_p$ into bit vectors $u_0$ through $u_p$. For example, for the 6.4 kbps IMBE speech coding system, the added forty-five error correction bits within the encoded vectors $v_0$ through $v_7$ are removed to recover the eighty-three prioritized speech bits comprising the bit vectors $u_0$ through $u_7$. With specific reference to the 7.1 kbps IMBE speech coding system implementation illustrated in FIG. 2, in the first mode, the added fifty-four parity bits within the encoded vectors $v_0$ through $v_6$ are removed to recover the eighty-eight prioritized speech bits comprising the bit vectors $u_0$ through $u_6$. In second mode, on the other hand, the added sixty-eight parity bits within the encoded vectors $v_0$ through $v_6$ are removed to recover the seventy-four prioritized speech bits comprising the bit vectors $u_0$ through $u_6$.

The number of bits t which can be corrected by a given code is fixed. For example, for the Hamming code only one bit can be corrected. For the Golay, extended Golay, and shortened Golay codes, on the other hand, three bits can be corrected. The error control decoders 40 receive not only the appropriate ones of the encoded vectors $v_0$ through $v_p$ to be decoded, but also their corresponding bit reliability values from the reliability vector r. Any one of a number of decoding techniques known to those skilled in the art may be implemented. For example, the reliability vector r may be ignored and the received vector v decoded using a hard decision decoding method. This decoding technique is a relatively low complexity implementation. Alternatively, the reliability vector r may be used to perform a soft decision type decoding (comprising perhaps errors and erasures decoding) of the received vector v. This decoding technique is a relatively medium complexity implementation. Still further, the reliability vector r may be used to perform a maximum likelihood decoding of the received vector v. This decoding technique is a relatively high complexity implementation. The error control decoders 40 further compute for output in conjunction with the bit vector u the Hamming distance $d_H$ between the closest candidate vector (corresponding to the selected output bit vector u) and the received vector v. This Hamming distance identifies the number of places where the bits of the candidate vector and the received vector v differ, thus providing an error estimate for output along with the bit vector u. It is further recognized at this point that in those implementations where no error control decoder is needed for the encoded vector $v_p$, the encoded vector $v_p$ is passed on as the bit vector $u_p$.

The receiver side 30 further includes a bit vector reconstruction unit 44 which receives the prioritized bit vectors $u_0$ through $u_p$, along with the corresponding error estimate information provided by the determined Hamming distances $d_H$, and outputs the plurality of quantizer values $b_0$ through $b_{L+2}$ relating to the 20 ms segment of speech. The Hamming distances $d_H$ are processed by the unit 44 as error estimate information to identify the reliability of the prioritized bit vectors $u_0$ through $u_p$. If the bit vectors u are deemed reliable, they are used to reconstruct the quantizer values $b_0$ through $b_{L+2}$ relating to corresponding 20 ms segment of speech. Conversely, if the bit vectors u are deemed unreliable, they are discarded and the quantizer values $b_0$ through $b_{L+2}$ relating to the corresponding 20 ms segment of speech are reconstructed by interpolation. The generated quantizer values $b_0$ through $b_{L+2}$ are then processed by a de-quantizer 46 to generate the speech for output.

Use of the Hamming distance $d_H$ between the closest candidate vector (corresponding to the selected output bit vector u) and the received vector v as a means for locating potential errors in the decoding operation is not preferred because the calculation tends to discard too much available and important information. It also does not exploit available channel tap estimate information. There is a need then for a better error estimation technique which would preferably implement a Euclidean distance calculation.

Conway-Sloane Decoding

In the receiver side 30, because of implementation complexity concerns, each of the error control decoders 40 of the system 10 typically comprises a soft decision decoder (and, in particular, an errors and erasures decoder). Such decoders exploit reliability values (from the reliability vector r) in estimating the transmitted codeword. In the absence of fading, and in the presence of Gaussian noise, the optimal soft decision decoder is the maximum likelihood decoder. It is also typically the best decoder in the presence of fading (assuming a good estimate of the fading is available). For a general block code, however, like those implemented in FIG. 1, maximum likelihood decoding can be hopelessly complex to implement. Accordingly, the soft decision decoding method is preferably implemented for the decoding process, but a need exists for a less complex maximum likelihood decoding scheme.

For the IMBE vocoding systems previously described, the encoders 16 implement in some cases a (24,12) extended Golay code and a (23,12) Golay code. For the special case of the (24,12) extended Golay code and the (23,12) Golay code, a maximum likelihood decoder having a very low complexity has been devised by Conway and Sloane (see, IEEE Trans. Infor. Theory, vol. 32, pp. 41–50, 1986). It is preferable to use the Conway-Sloane decoder for these cases as performance improves with no appreciable increase in processing complexity.

For the Conway-Sloane decoding method, the received vector v and its corresponding reliability vector r are combined to produce a modified received vector w. The i-th component of the vector w is given by:

$$w_i = (1-2v_i)r_i \quad (1)$$

where $v_i$ is the i-th component of v, and $r_i$ is the i-th component or r. Maximum likelihood decoding is now performed on the modified received vector w instead of the received vector r.

For an (n,k) binary linear code $\Lambda$, let $y=(y_1,\ldots,y_n)$ denote a codeword in $\Lambda$, where $y_1 \in \{0,1\}$ and $l=1,\ldots,n$. Also, let $\bar{y}$ denote y in antipodal form (+1,−1) with elements:

$$\bar{y}_1 = (1-2y_1) \quad (2)$$

where $l=1,\ldots,n$. A maximum likelihood decoder finds a codeword $y^*$ such that $\bar{y}^*$ is closest to w in Euclidean distance. This is the same as saying that $\bar{y}^*$ has the largest inner product which is given by:

$$w_1\bar{y}_1^* + w_2\bar{y}_2^* + \ldots + w_n\bar{y}_n^* \quad (3)$$

Now consider a generator matrix G for the (n,k) binary linear code $\Lambda$. It is useful to treat the matrix as having an upper matrix G' and a lower matrix G" as follows:

$$G = \begin{bmatrix} G' \\ G'' \end{bmatrix} \quad (4)$$

where G' has k' rows, and G" has k" rows. Let Λ' denote the set of codewords $y_j'$ generated by G', where $j=0, \ldots, 2^{k'}-1$. Also, let $y_i"$ denote a codeword generated by G", where $i=0, \ldots, 2^{k"}-1$. Then:

$$\Lambda_i' = \{y_i" + y_j', y_j' \in \Lambda'\} \quad (5)$$

is called a coset of Λ' in the Λ. The cosets $\Lambda_i'$ are disjoint, but their union is equal to the code Λ.

It is also noted that comparing the received vector v to the elements of $\Lambda_i'$ is equivalent to comparing $w * \bar{y}_i"$ to the elements of Λ', where:

$$w * \bar{y}_i" = \{v_1 \bar{y}_{i1}", \ldots, v_n \bar{y}_{in}"\} \quad (6)$$

and where: $\bar{y}_i" = (\bar{y}_{i1}", \ldots, \bar{y}_{in}")$ is $y_i"$ in antipodal form. Now, the search for y* is organized as follows: an outer loop executed over $y_i"$, and an inner loop is executed over the elements of Λ'.

The generator matrix G for the (24,12) extended Golay code may conveniently be represented as an upper matrix G':

$$G' = \begin{bmatrix} 1111 & 1111 & 0000 & 0000 & 0000 & 0000 \\ 1111 & 0000 & 1111 & 0000 & 0000 & 0000 \\ 1111 & 0000 & 0000 & 1111 & 0000 & 0000 \\ 1111 & 0000 & 0000 & 0000 & 1111 & 0000 \\ 1111 & 0000 & 0000 & 0000 & 0000 & 1111 \end{bmatrix} \quad (7)$$

and a lower matrix G":

$$G" = \begin{bmatrix} 1100 & 1100 & 1100 & 1100 & 0000 & 0000 \\ 1010 & 1010 & 1010 & 1010 & 0000 & 0000 \\ 1010 & 1001 & 1100 & 0000 & 1100 & 0000 \\ 1001 & 1100 & 1010 & 0000 & 1010 & 0000 \\ 0111 & 1000 & 1000 & 1000 & 1000 & 1000 \\ 0000 & 0000 & 1100 & 1100 & 1100 & 1100 \\ 0111 & 1000 & 1000 & 1000 & 1000 & 1000 \\ 0000 & 0000 & 1010 & 1010 & 1010 & 1010 \end{bmatrix} \quad (8)$$

It is noted that the upper matrix G' has a very simple structure. In fact, Λ' is an even parity code repeated four times. Maximum likelihood decoding of the vector w over Λ' is accomplished by forming six 4-tuple sums (I through VI):

$$\alpha_I = w_1 + w_2 + w_3 + w_4, \ldots, \alpha_{VI} = w_{21} + w_{22} + w_{23} + w_{24} \quad (9)$$

If the number of negative $\alpha_N$'s is odd, the $\alpha_N$ having the smallest magnitude is found and its sign is changed. Now, let:

$$\beta_I = \text{sign}(\alpha_I), \ldots, \beta_{VI} = \text{sign}(\alpha_{VI}) \quad (10)$$

and the maximum likelihood codeword is then given by:

$$(\beta_I \beta_I \beta_I \beta_I, \ldots, \beta_{VI} \beta_{VI} \beta_{VI} \beta_{VI}) \quad (11)$$

and the inner product is:

$$p = |\alpha_I| + \ldots + |\alpha_{VI}| \quad (12)$$

to replace the inner loop of the search.

With respect to the outer loop, in order to produce the sums of Equation (9), one hundred twenty-eight modified versions of w need to be computed. By inspection of the lower matrix G", it is noted that all possible sign combinations of $w_1$ through $w_4$ are produced. The same is true for each of the remaining five 4-tuples except that $w_{12}$, $w_{16}$, $w_{20}$, and $w_{24}$ do not change sign. In this instance, efficiency is obtained by pre-computing $\alpha_I$ through $\alpha_{VI}$ under all sign combinations, and then storing the results in six tables (referred to as $\sigma_I$ through $\sigma_{VI}$). At each step of the outer loop, then, the appropriate entries from the six tables are extracted. To further improve the operational processing of the outer loop, the entries for the six tables are computed in a Gray code ordering so that the current sum is found from the prior sum using a single subtraction instead of three additions/subtractions.

To implement the decoding algorithm, the plural $y_i"$ items are ordered in some fashion, and then for every $y_i"$ the 4-tuples are mapped in their Gray code numbers $\gamma_N^i$. The table of Gray code numbers is stored within the read only memory (ROM) of the decoder. When w is received, the six sum tables $\sigma_N$ are pre-computed. In this example of the (24,12) extended Golay code, the sum tables $\sigma_I$ and $\sigma_{II}$ each have sixteen entries, and the remaining sum tables $\sigma_{III}$ through $\sigma_{VI}$ have eight entries each. The main loop of the process is then executed as follows:

Let p'=0, i'=0, and $\delta = (\delta_1, \ldots, \delta_n) = (0, \ldots 0)$
For i=0 to 127
  Let $\alpha_I = \sigma_I(\gamma_I^i), \ldots, \alpha_{VI} = \sigma_{VI}(\gamma_{VI}^i)$
  Let $p = |\alpha_I| + \ldots + |\alpha_{VI}|$
  If odd number of negative $\alpha_N$'s:
    switch sign of smallest magnitude $\alpha_N$
    let $p = p - 2 \min_N |\alpha_N|$
  Compute $\beta_I = \text{sign}(\alpha_I), \ldots, \beta_{VI} = \text{sign}(\alpha_{VI})$
  If p>p', let p'=p, i'=i, and
    $\delta' = (\beta_I \beta_I \beta_I \beta_I, \ldots, \beta_{VI} \beta_{VI} \beta_{VI} \beta_{VI})$
The maximum likelihood codeword in antipodal form is then:
  $\bar{y}^* = (\delta_1 \bar{y}_{i1}", \ldots, \delta_n \bar{y}_{in}")$,
or in binary form:
  $y^* = \frac{1}{2} - \frac{1}{2}\bar{y}^*$, with the corresponding information bits denoted u*. In summary then, y* is the maximum likelihood estimate of the modified received codeword w.

The foregoing procedure has been extended for use in decoding (23,12) Golay code. The generator matrix $G_1$ for the (23,12) Golay code is found by removing the first column from the upper matrix G' and lower matrix G" over Equations (7) and (8), respectively. The foregoing algorithm used for the (24,12) extended Golay code is then also used to decode the modified received vector w. To implement this, a zero is appended to the received vector w. Since the received vector w is nominally antipodal, a zero value is equivalent to an erasure.

Use of the Conway-Sloane algorithm in decoding either the (24,12) extended Golay code or the (23,12) Golay code provides a marked improvement over the use of other known techniques (especially those implementing a "brute force" searching approach). It is noted, however, that the receiver side 30 in many IMBE speech coding systems (for example, the 7.1 kbps IMBE speech coding system) includes a number of individual error control decoders 40 which must decode various shortened Golay codes such as the (19,7) Golay code, the (18,7) Golay code, and the (18,6) Golay code. Currently, decoding algorithms not as efficient as the Conway-Sloane algorithm (such as those comprising errors and erasures decoders) are being used to implement the necessary decoding operations for these shortened Golay codes. There would be an advantage, however, if the efficient Conway-Sloane algorithm could be extended for use in connection with the decoding of such shortened Golay codes.

SUMMARY OF THE INVENTION

To address the foregoing need with respect to the computation of an improved error estimate for a decoded bit vector, an error control decoder of the present invention receives a received vector to be decoded. The decoder processes calculates, as the error estimate, the Euclidean distance between a codeword choice and the received vector. The output error estimate is appropriately scaled and quantized in accordance with the particular code being implemented by the decoder.

To address the foregoing need with respect to the extension of the efficient Conway-Sloane algorithm for use in connection with the decoding of shortened Golay codes, the present invention modifies the generator matrix for the Golay code to produce a modified generator matrix that is specific for and tailored to the decoding of each shortened code. The modified generator matrix is then efficiently implemented in the Conway-Sloane algorithm to identify the best codeword for conversion to its corresponding information bits for output. In particular, the modified generator matrix comprises the Golay code generator matrix with specially chosen rows and columns deleted.

BRIEF DESCRIPTION OF THE DRAWINGS

A more complete understanding of the method and apparatus of the present invention may be acquired by reference to the preceding Background of the Invention and the following Detailed Description when taken in conjunction with the accompanying Drawings wherein.

DETAILED DESCRIPTION OF THE INVENTION

Figure 1:
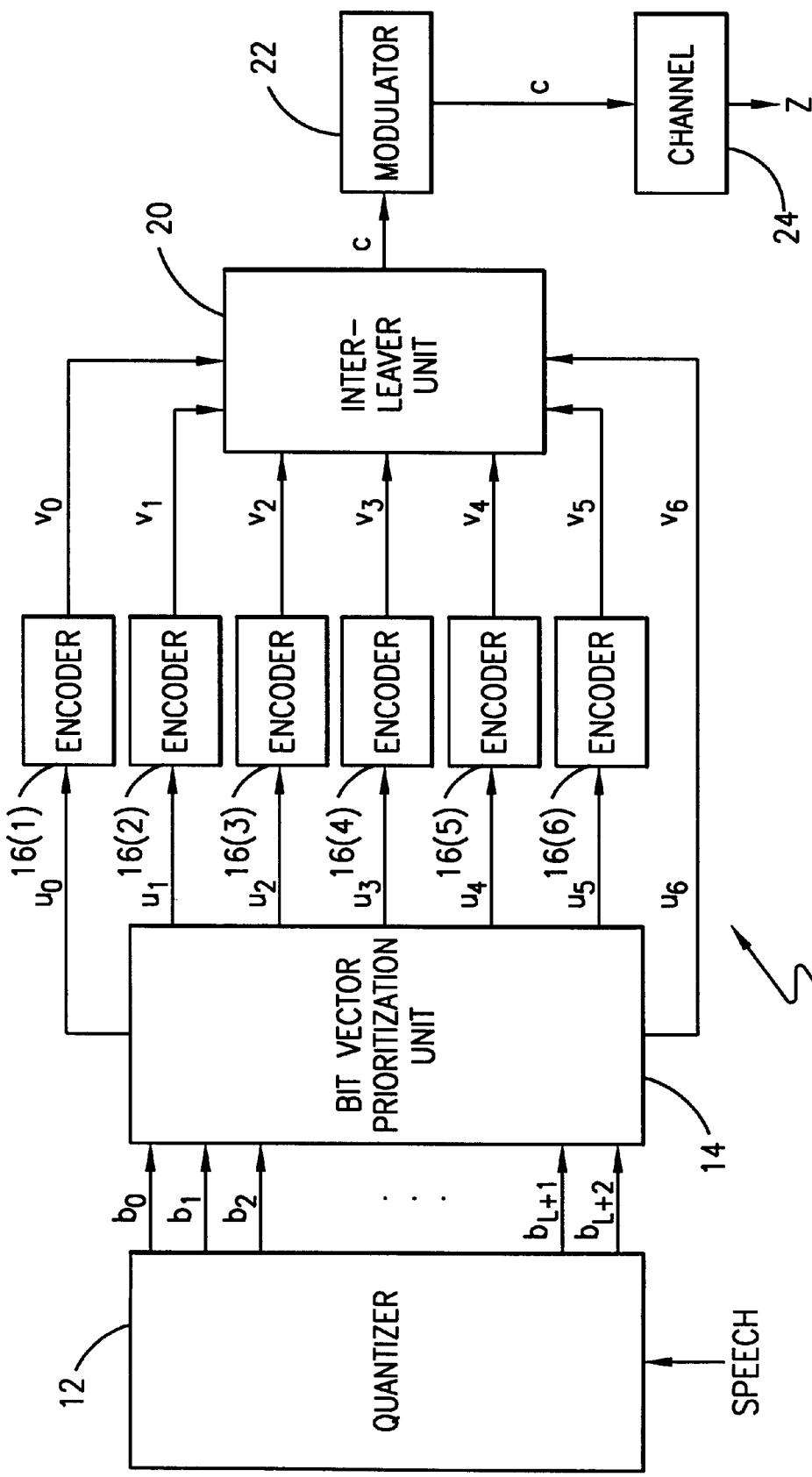
FIG. 1 is a block diagram of a transmitter side for an improved multi-band excitation (IMBE) vocoding system.
Figure 2:
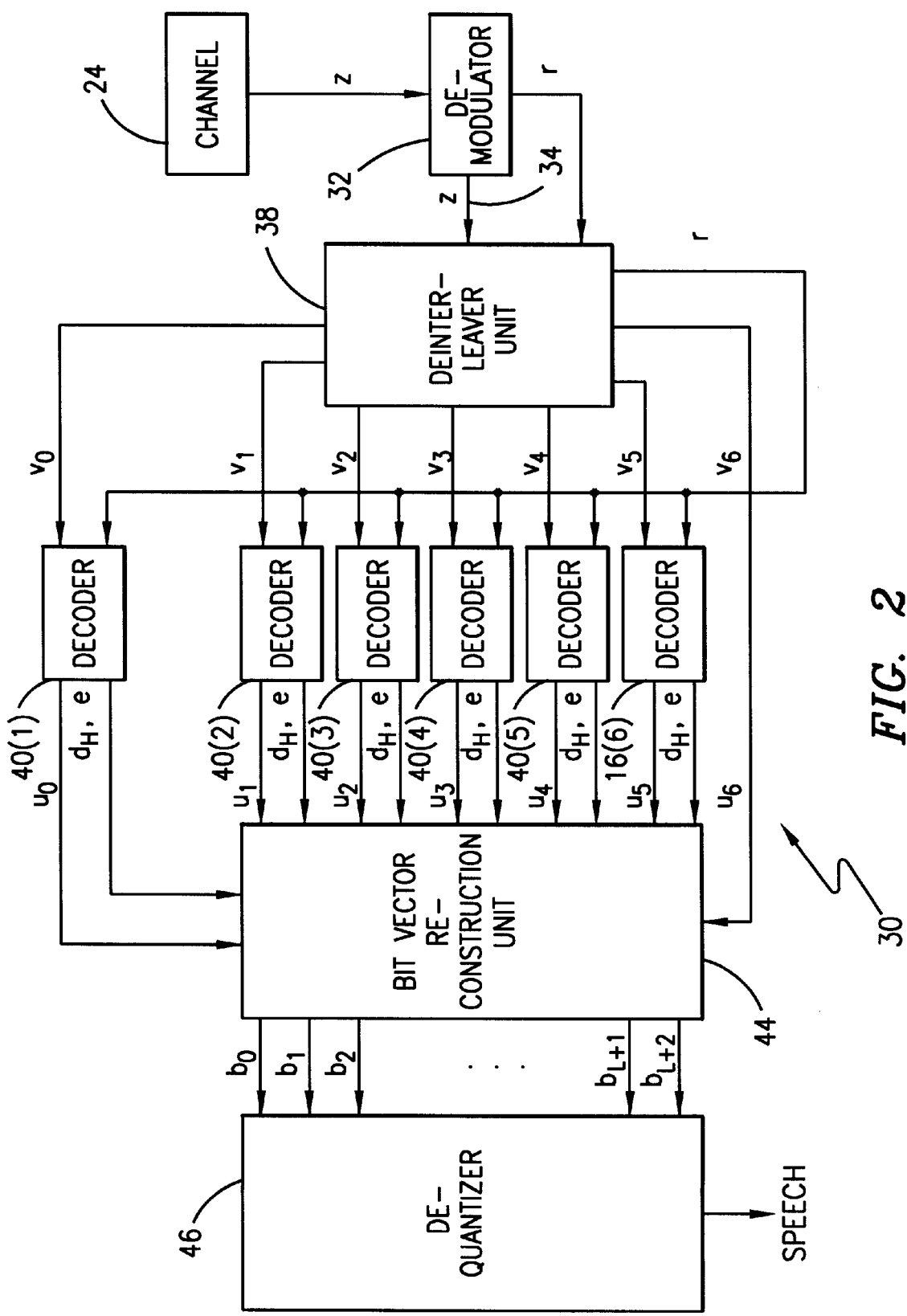
FIG. 2 is a block diagram of a receiver side for the improved multi-band excitation (IMBE) vocoding system.
Figure 3:
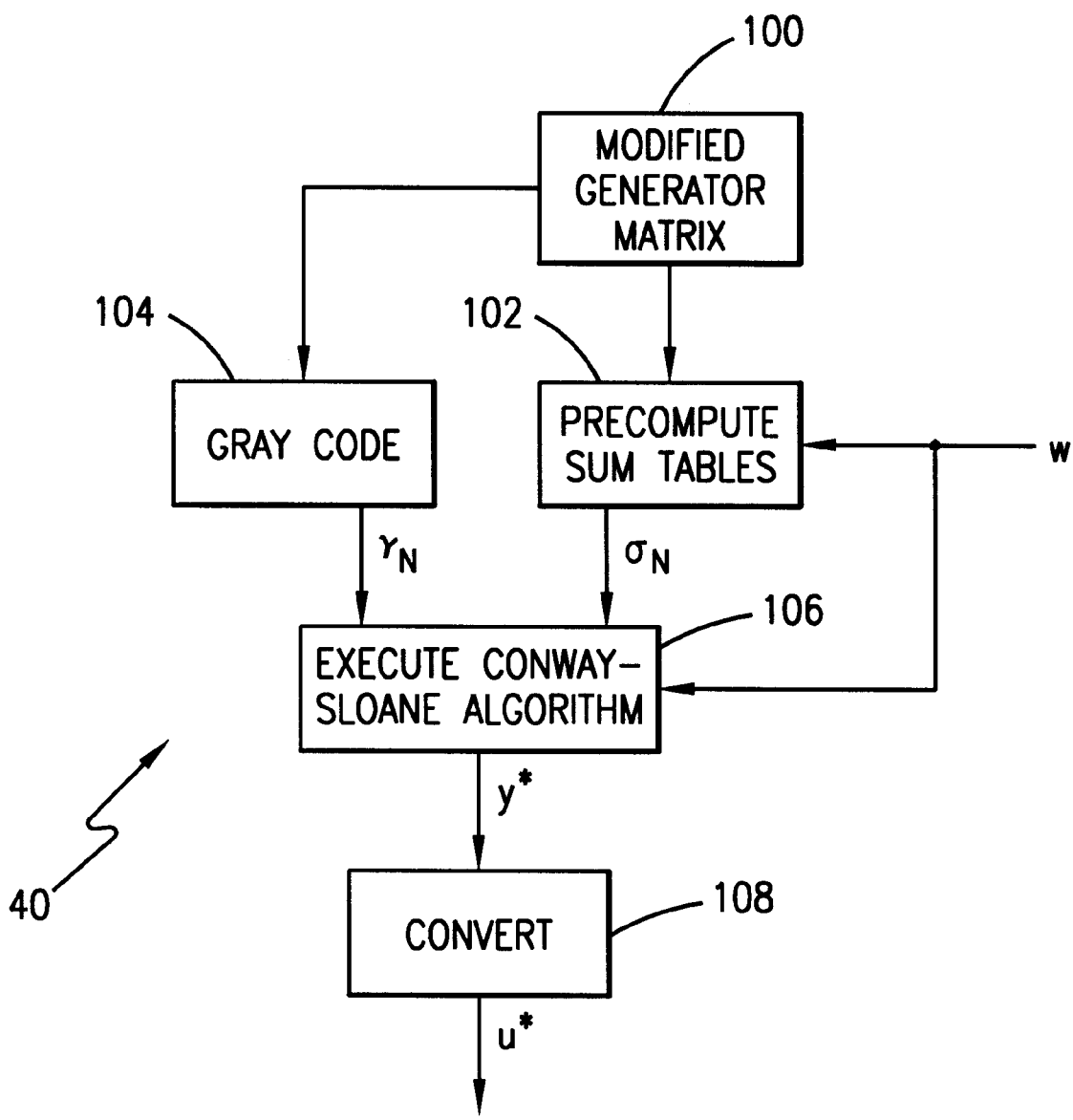
FIG. 3 is a block diagram of a decoder of the present invention implementing the Conway-Sloane algorithm for decoding shortened Golay encoded information.

Referring now to FIG. 3, wherein there is shown a block diagram of a decoder of the present invention, the Conway-Sloane technique is extended for use by appropriate ones of the decoders 40 in decoding (19,7) shortened Golay code encoded vectors. The generator matrix G for the (24,12) extended Golay code is manipulated to produce a modified generator matrix $G_2$ 100 for use in decoding the (19,7) extended Golay code. In particular, columns twenty, twenty-one, twenty-two, twenty-three and twenty-four are removed from the generator matrix G, and only rows one, two, three, six, seven, eight and nine of the generator matrix G are kept. As a result, the generator matrix $G_2$ for the (19,7) extended Golay code may conveniently be represented as an upper matrix $G_2'$:

$$G_2' = \begin{bmatrix} 1111 & 1111 & 0000 & 0000 & 000 \\ 1111 & 0000 & 1111 & 0000 & 000 \\ 1111 & 0000 & 0000 & 1111 & 000 \end{bmatrix} \quad (13)$$

and a lower matrix $G_2''$:

$$G_2'' = \begin{bmatrix} 1100 & 1100 & 1100 & 1100 & 000 \\ 1010 & 1010 & 1010 & 1010 & 000 \\ 1010 & 1001 & 1100 & 0000 & 110 \\ 1001 & 1100 & 1010 & 0000 & 101 \end{bmatrix} \quad (14)$$

Three processing efficiencies are encountered with respect to the use of the generator matrix $G_2$ for the (19,7) extended Golay code in the Conway-Sloane algorithm. First, since the last three columns in the upper matrix $G_2'$ are zero, only the first four sum tables $\sigma_N$ 102 need to be pre-computed and stored in response to the received vector w. Second, since the lower matrix $G_2''$ shares the first four rows of the lower matrix G", the loop size for the algorithm becomes sixteen instead of one hundred twenty-eight. Third, only the even entries in the four sum tables $\sigma_N$ are actually used by the algorithm, and thus need to be pre-computed and stored. Gray code values 104 are also stored.

The Conway-Sloane algorithm is then executed 106 on the received vector w (or vector v) in view of the generator matrix $G_2$. The main loop of the process is executed as follows:

Let p'=0, i'=0, and $\delta=(\delta_1, \ldots, \delta_n)=(0, \ldots, 0)$
For i=0, 8, 16, ..., to 120
    Let $\alpha_I=\sigma_I(\gamma_I^i), \ldots, \alpha_{IV}=\sigma_{IV}(\gamma_{IV}^i)$
    Let $p=|\alpha_I|+\ldots+|\alpha_{IV}|$
    If odd number of negative $\alpha_N$'s:
        switch sign of smallest magnitude $\alpha_N$
        let $p=p-2 \min_N |\alpha_N|$
    Compute $\beta_I=\text{sign}(\alpha_I), \ldots, \beta_{IV}=\text{sign}(\alpha_{IV})$
    If p>p', let p'=p, i'=i, and
        $\delta'=(\beta_I\beta_I\beta_I\beta_I, \ldots, \beta_{IV}\beta_{IV}\beta_{IV}\beta_{IV},+1,+1,+1)$ The maximum likelihood codeword in antipodal form is then:
$\bar{y}^*=(\delta_1 \bar{y}_{i1}^*, \ldots \delta_n^* \bar{y}_{in})$,
or in binary form:
$y^*=\frac{1}{2}-\frac{1}{2}\bar{y}^*$, with the corresponding information bits denoted u*. In summary then, y* is the maximum likelihood estimate of the modified received codeword w.

Referring again to FIG. 3, in accordance with the present invention, the Conway-Sloane technique is extended for use appropriate ones of the decoders 40 in decoding (18,6) shortened Golay code encoded vectors. The generator matrix G for the (24,12) extended Golay code is manipulated to produce a modified generator matrix $G_3$ 100 for use in decoding the (18,6) extended Golay code. In particular, columns sixteen, twenty, twenty-one, twenty-two, twenty-three and twenty-four are removed from the generator matrix G, and only rows one, two, six, seven, eight and nine of the generator matrix G are kept. As a result, the generator matrix $G_3$ for the (18,6) extended Golay code may conveniently be represented as an upper matrix $G_3'$:

$$G_3' = \begin{bmatrix} 1111 & 1111 & 0000 & 000 & 000 \\ 1111 & 0000 & 1111 & 000 & 000 \end{bmatrix} \quad (15)$$

and a lower matrix $G_3''$:

$$G_3'' = \begin{bmatrix} 1100 & 1100 & 1100 & 110 & 000 \\ 1010 & 1010 & 1010 & 101 & 000 \\ 1010 & 1001 & 1100 & 000 & 110 \\ 1001 & 1100 & 1010 & 000 & 101 \end{bmatrix} \quad (16)$$

Three processing efficiencies are encountered with respect to the use of the generator matrix $G_3$ for the (18,6) extended Golay code in the Conway-Sloane algorithm. First, since the last six columns in the upper matrix $G_3'$ are zero, only the first three sum tables $\sigma_N$ 102 need to be pre-computed and stored in response to the received vector v. Second, since the lower matrix $G_3''$ shares the first four rows of the lower matrix G", the loop size for the algorithm becomes sixteen instead of one hundred twenty-eight. Third, only the even entries in the four sum tables $\sigma_N$ are actually used by the algorithm, and thus need to be pre-computed and stored. Gray code values 104 are also stored.

The Conway-Sloane algorithm is then executed 106 on the modified received vector w (or received vector v) in view of the generator matrix $G_3$. The main loop of the process is executed as follows:

Let p'=0, i'=0, and $\delta=(\delta_1, \ldots, \delta_n)=(0, \ldots, 0)$
For i=0, 8, 16, ..., to 120
   Let $\alpha_I=\sigma_I(\gamma_I^i), \ldots, \alpha_{III}=\sigma_{III}(\gamma_{III}^i)$
   Let $p=|\alpha_I|+\ldots+|\alpha_{III}|$
   If odd number of negative $\alpha_N$'s:
     switch sign of smallest magnitude $\alpha_N$
     let $p=p-2 \min_N |\alpha_N|$
   Compute $\beta_I=\text{sign}(\alpha_I), \ldots, \beta_{III}=\text{sign}(\alpha_{III})$
   If p>p', let p'=p, i'=i, and
     $\delta'=(\beta_I\beta_I\beta_I\beta_I, \ldots, \beta_{III}\beta_{III}\beta_{III}\beta_{III}, +1, \ldots, +1)$ The maximum likelihood codeword in antipodal form is then:
   $\bar{y}^*=(\delta_1\bar{y}_{i1}", \ldots, \delta_n\bar{y}_{in}")$,
   or in binary form:
   $y^*=\frac{1}{2}-\frac{1}{2}\bar{y}^*$, with the corresponding information bits denoted u*. In summary then, y* is the maximum likelihood estimate of the modified received codeword w.

Referring again to FIG. 3, in accordance with the present invention, the Conway-Sloane technique is extended for use appropriate ones of the decoders 40 in decoding (18,7) shortened Golay code encoded vectors. The generator matrix G for the (24,12) extended Golay code is manipulated to produce a modified generator matrix $G_4$ 100 for use in decoding the (18,7) extended Golay code. In particular, columns one, twenty, twenty-one, twenty-two, twenty-three and twenty-four are removed from the generator matrix G, and only rows one, two, three, six, seven, eight and nine of the generator matrix G are kept. As a result, the generator matrix $G_4$ for the (18,7) extended Golay code may conveniently be represented as an upper matrix $G_4'$:

$$G_4' = \begin{bmatrix} 111 & 1111 & 0000 & 0000 & 000 \\ 111 & 0000 & 1111 & 0000 & 000 \\ 111 & 0000 & 0000 & 1111 & 000 \end{bmatrix} \quad (17)$$

and a lower matrix $G_4''$:

$$G_4'' = \begin{bmatrix} 100 & 1100 & 1100 & 1100 & 000 \\ 010 & 1010 & 1010 & 1010 & 000 \\ 010 & 1001 & 1100 & 0000 & 110 \\ 001 & 1100 & 1010 & 0000 & 101 \end{bmatrix} \quad (18)$$

Three process efficiencies are encountered with respect to the use of the generator matrix $G_4$ for the (18,7) extended Golay code in the Conway-Sloane algorithm. First, since the last three columns in the upper matrix $G_4'$ are zero, only the first four sum tables $\sigma_N$ 102 need to be pre-computed and stored. Second, since the lower matrix $G_4''$ shares the first four rows of the lower matrix G", the loop size for the algorithm becomes sixteen instead of one hundred twenty-eight. Third, only the even entries in the four sum tables $\sigma_N$ are actually used by the algorithm, and thus need to be pre-computed and stored. Gray code values 104 are also stored.

The Conway-Sloane algorithm is then executed 106 on the modified received vector w (or the received vector v) in view of the generator matrix $G_4$. The main loop of the process is executed as follows:

Let p'=0, i'=0, and $\delta=(\delta_1, \ldots, \delta_n)=(0, \ldots, 0)$
For i=0, 8, 16, ..., to 120
   Let $\alpha_I=\sigma_I(\gamma_I^i), \ldots, \alpha_{IV}=\sigma_{IV}(\gamma_{IV}^i)$
   Let $p=|\alpha_I|+\ldots+|\alpha_{IV}|$
   If odd number of negative $\alpha_N$'s:
     switch sign of smallest magnitude $\alpha_N$
     let $p=p-2 \min_N |\alpha_N|$
   Compute $\beta_I=\text{sign}(\alpha_I), \ldots, \beta_{IV}=\text{sign}(\alpha_{IV})$
   If p>p', let p'=p, i'=i, and
     $\delta'=(\beta_I\beta_I\beta_I\beta_I, \ldots, \beta_{IV}\beta_{IV}\beta_{IV}\beta_{IV}, +1,+1,+1)$ The maximum likelihood codeword in antipodal form is then:
   $\bar{y}^*=(\delta_1\bar{y}_{i1}", \ldots \delta_n\bar{y}_{in}")$,
   or in binary form:
   $y^*=\frac{1}{2}-\frac{1}{2}\bar{y}^*$, with the corresponding information bits denoted u*. In summary then, y* is the maximum likelihood estimate of the modified received codeword w. In essence, and as an alternative, the same processing algorithm as used for the (19,7) extended Golay code discussed above may again be used here by appending a zero to the received vector w.

As discussed previously, the conventional error correction decoder 40 computes the Hamming distance d, between the candidate vector (corresponding to the selected closest bit vector u) and the received vector v. This Hamming distance identifies the number of places where the bits of candidate vector and the received vector v differ, thus providing an error estimate for output along with the bit vector u. Use of the Hamming distance is not preferred, however, because the Hamming distance calculation tends to discard too much available and important information. It also does not exploit available channel tap estimate information. A Euclidean distance calculation rather than a Hamming distance calculation would provide better results.

Figure 4:
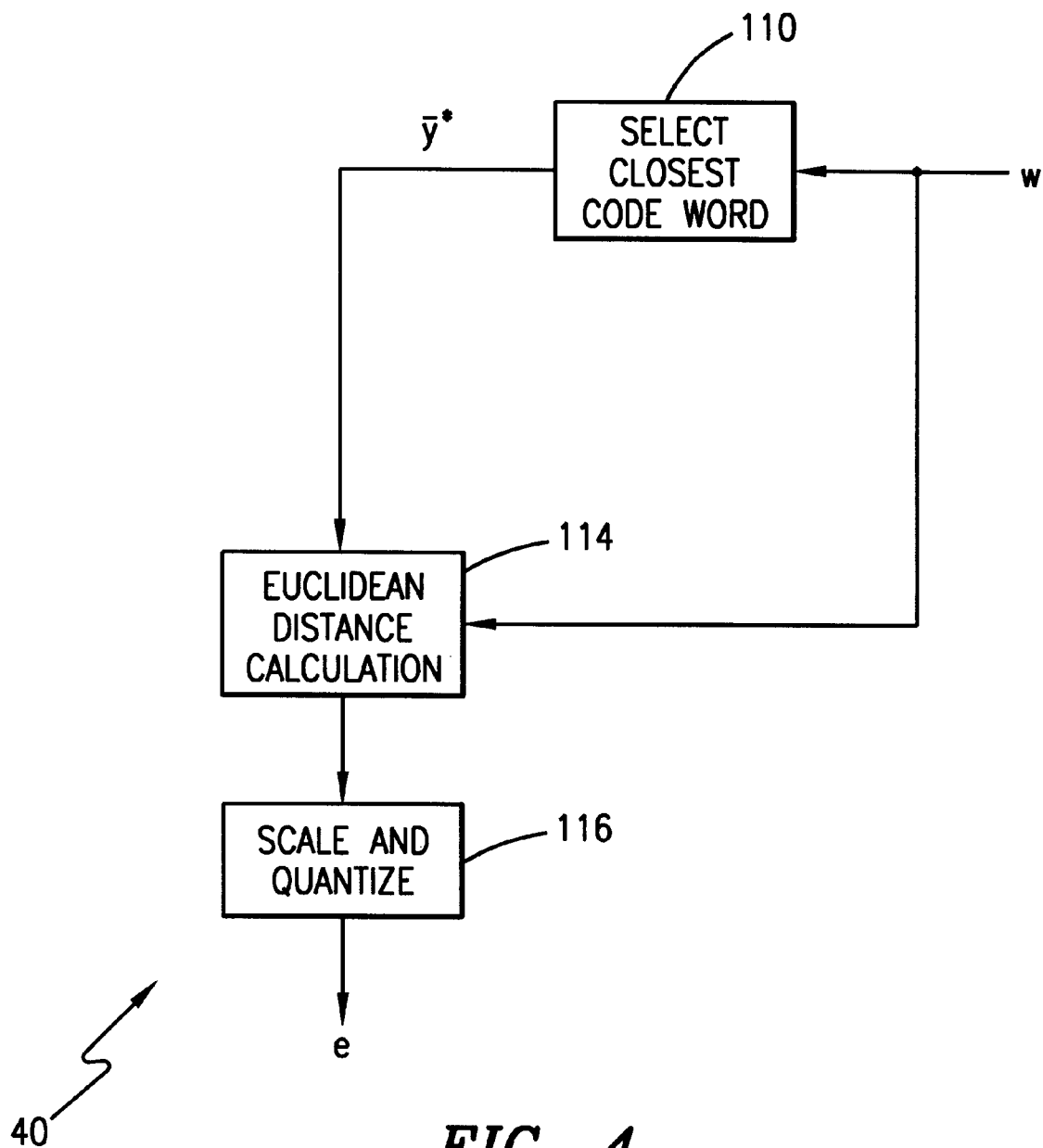
FIG. 4 is a block diagram of a decoder of the present invention implementing a Euclidean distance based error estimation determination.

Reference is now made to FIG. 4 wherein there is shown a block diagram of a decoder 40 of the present invention implementing a Euclidean distance based error estimation determination. Let $\bar{y}^*$ denote the selected codeword choice y* 110 in antipodal form. The error estimate for the decoding operation is determined by computing the Euclidean distance $d_E$ 114 between the received vector w and $\bar{y}^*$ as follows:

$$e = d_E(w, \overline{y}^*) = \sqrt{\sum_{m=1}^{n} |w_n - \overline{y}^*_m|^2} \quad (19)$$

The error estimate e is then appropriately scaled and quantized 116 in accordance with the type of code at issue. For example, for the error control decoders 40 decoding the Hamming codes, e is scaled and quantized to be either zero or one. For the Golay codes, on the other hand, e is scaled and quantized to be either zero, one, two or three.

The deinterleaver unit 38, decoders 40 (including their functional component parts illustrated in FIGS. 3 and 4), and bit vector reconstruction unit 44 are all preferably implemented as a specialized digital signal processor (DSP) or in an application specific integrated circuit (ASIC). It will, of course, be understood that the deinterleaver unit 38, decoders 40 (including their functional component parts illustrated in FIGS. 3 and 4), and bit vector reconstruction unit 44 may alternatively be implemented using discrete components and perhaps distributed processing. In either case, the deinterleaver unit 38, decoders 40 (including their functional component parts illustrated in FIGS. 3 and 4), and bit vector reconstruction unit 44 each perform and implement the functional operations previously described.

Although preferred embodiments of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A decoder receiving a received vector to be decoded, comprising:

means for determining a codeword choice closest to the received vector;

means for determining the Euclidean distance between the received vector and the codeword choice, the determined Euclidean distance output as an error estimate for the decoded received vector; and means for scaling and quantizing the error estimate in accordance with a given type of code;

wherein the given type of code comprises a Golay code, and the error estimate is scaled and quantized to a value of either zero, one, two or three.

2. The decoder as in claim 1 wherein the Euclidean distance is calculated between the received vector in antipodal form and the codeword choice also in antipodal form.

3. A decoder for decoding a received vector encoded in accordance with an (n',k') shortened Golay code wherein the decoder executes a Conway-Sloane algorithm on the received vector to identify a codeword choice closest to the received vector, the executed Conway-Sloane algorithm utilizing a generator matrix $G_m$ for the shortened Golay code, wherein the generator matrix $G_m$ comprises a modification of a generator matrix G for an (n,k) Golay code, wherein n'<n and k'<k, and wherein the generator matrix G includes a plurality of rows and a plurality of columns, and wherein the modification of the generator matrix G to produce the generator matrix $G_m$ comprises the removal of certain plural ones of both the rows and columns of the generator matrix G.

4. The decoder as in claim 3 wherein the (n,k) Golay code comprises a (24,12) Golay code, and wherein the (n',k') shortened Golay code comprises a (19,7) shortened Golay code.

5. The decoder as in claim 4 wherein the generator matrix G includes twelve rows and twenty-four columns, and wherein the modification producing the generator matrix $G_m$ comprises the removal of columns twenty, twenty-one, twenty-two, twenty-three and twenty four, and the removal of rows four, five, ten, eleven and twelve.

6. The decoder as in claim 3 wherein the (n,k) Golay code comprises a (24,12) Golay code, and wherein the (n',k') shortened Golay code comprises an (18,6) shortened Golay code.

7. The decoder as in claim 6 wherein the generator matrix G includes twelve rows and twenty-four columns, and wherein the modification producing the generator matrix $G_m$ comprises the removal of columns sixteen, twenty, twenty-one, twenty-two, twenty-three and twenty four, and the removal of rows three, four, five, ten, eleven and twelve.

8. The decoder as in claim 3 wherein the (n,k) Golay code comprises a (24,12) Golay code, and wherein the (n',k') shortened Golay code comprises an (18,7) shortened Golay code.

9. The decoder as in claim 8 wherein the generator matrix G includes twelve rows and twenty-four columns, and wherein the modification producing the generator matrix $G_m$ comprises the removal of columns one, twenty, twenty-one, twenty-two, twenty-three and twenty four, and the removal of rows four, five, ten, eleven and twelve.

10. The decoder as in claim 8 wherein the generator matrix G includes twelve rows and twenty-four columns, and wherein the modification producing the generator matrix $G_m$ comprises the removal of columns twenty, twenty-one, twenty-two, twenty-three and twenty four, and the removal of rows four, five, ten, eleven and twelve, and further including the appending of a zero to the received vector prior to execution of the Conway-Sloane algorithm.

\* \* \* \* \*